(12) United States Patent
Sheng

(10) Patent No.: US 8,072,341 B2
(45) Date of Patent: Dec. 6, 2011

(54) DETACHABLE BATTERY STATUS ALARM AND BATTERY DETECTOR THEREOF

(75) Inventor: Hsien-Fang Sheng, Taipei (TW)

(73) Assignee: DHC Specialty Corp., Taipei (TW)

( * ) Notice: Subject to any disclaimer, the term of this patent is extended or adjusted under 35 U.S.C. 154(b) by 465 days.

(21) Appl. No.: 12/326,222

(22) Filed: Dec. 2, 2008

(65) Prior Publication Data
US 2009/0179763 A1 Jul. 16, 2009

(30) Foreign Application Priority Data

Jan. 16, 2008 (TW) .............................. 97101602 A

(51) Int. Cl.
*G08B 21/00* (2006.01)

(52) U.S. Cl. ............... 340/636.1; 340/687; 324/426; 702/185

(58) Field of Classification Search ............... 340/636.1, 340/636.11–636.19, 687; 324/433, 426, 324/430, 435; 702/183, 185
See application file for complete search history.

(56) References Cited

U.S. PATENT DOCUMENTS

| | | | | |
|---|---|---|---|---|
| 6,737,831 B2 * | 5/2004 | Champlin | ..................... | 320/132 |
| 7,076,375 B2 * | 7/2006 | Raichle et al. | .................. | 702/63 |
| 7,129,706 B2 * | 10/2006 | Kalley | .......................... | 324/426 |
| 7,235,977 B2 * | 6/2007 | Koran et al. | .................. | 324/426 |
| 7,295,936 B2 * | 11/2007 | Bertness et al. | ................ | 702/63 |

* cited by examiner

*Primary Examiner* — Toan N Pham
(74) *Attorney, Agent, or Firm* — Rabin & Berdo, P.C.

(57) ABSTRACT

A detachable battery status alarm has an alarm device and at least one battery detector. The battery detector is directly mounted on the battery and electronically connected to the battery. The alarm device links to the battery detector to obtain the battery status in a physical connection or a wireless connection. Therefore, the alarm device does not physically connect to the battery or batteries to test the battery or batteries.

29 Claims, 13 Drawing Sheets

DETACHABLE BATTERY STATUS ALARM AND BATTERY DETECTOR THEREOF

BACKGROUND OF THE INVENTION

1. Field of the Invention

The present invention relates to a battery tester, and more particularly to a detachable battery status alarm and at least one battery status detector thereof.

2. Description of Related Art

With reference to FIG. 8, a conventional battery tester (40) is manually clipped to a battery (43) and detects and tests battery status. The battery tester (40) further has a wire (41) and two pairs of tongs (42). The wire (41) is connected to the pairs of the tongs (42). Since the battery (43) has a positive terminal (431) and a negative terminal (431), the two pairs of the tongs (42) are respectively clipped to the corresponding terminals (431). Therefore, a user operates buttons on the battery tester (40) to read and determine the current battery status.

Since one user only uses a battery tester (40) to test one battery (43), it will take longer to test multiple batteries. In addition, the user has to re-clip the terminals (431) of the battery (43).

With further reference to FIG. 9, someone proposed a real time monitoring system for a battery set consisted of serial connecting battery units (541). A first example of the monitoring system has a remote computer (50), a single battery monitor (51) and a sensing module (53). The battery monitor (51) has multiple pairs of inputs connected to the corresponding battery unit (541) of the battery set (54). Therefore, the battery monitor (51) obtains the battery status of each battery unit (541). The battery monitor (51) is further connected to the sensing module (53) and the sensing module has a temperature sensor and a moisture sensor. Therefore, the battery monitor (51) obtains external status around the battery set (54). Since the battery monitor (51) is connected to the remote computer (50), the battery statuses and external status of the battery set will be further transmitted to the remote computer (50). Then the remote 8 computer (50) stores and analyzes whether the battery unit is normal or not. However, if one battery unit (541) of the battery set (54) is damaged, the battery monitor does not obtain the battery statues of other normal battery unit (541) of the battery set (54).

With reference to FIG. 10, a second example of the monitoring system is used to monitor multiple battery sets (54), so further has more battery monitors (52) and more sensing modules (53). The battery monitors (51)(52) are connected in serial and one of the battery monitor (51) is connected to the remote computer (50). The battery monitor (51)(52) are connected to the corresponding battery set (54) to obtain the current battery statuses of the corresponding battery set (54). Further, each battery monitor (51)(52) is connected to the corresponding sensing module (53) and the sensing modules (53) are mounted next to the corresponding battery set (54). Therefore, each battery monitor (51)(52) further obtains external status of the corresponding battery set (54) through the sensing module (53).

Since the battery monitors (51)(52) are connected in serial, the battery monitor (51) connected to the remote computer (50) collects the battery statuses of other battery sets (54) through other battery monitors (52). Then the battery monitor (51) transmits the battery statuses of all battery sets (54) to the remote computer (50). However, the second example not only has the drawback of the first example, but also one of the battery monitor is damaged the battery monitor (51) connected to the remote computer (50) does not collect all battery statuses of the battery sets (54). Further, if the battery monitor (51) connected to the remote computer is damaged, other normal battery monitors (52) do not transmit battery statuses of the battery sets (54) to the remote computer (50).

In addition, the battery units or battery sets are usually scattered at different places in a factory and it is difficult to connect the battery monitors and corresponding battery sets and the remote computer.

SUMMARY OF THE INVENTION

The main objective of the present invention is to provide a detachable battery status alarm and at least one battery detector thereof that is easily mounted at the corresponding battery and immediately determines whether the battery or batteries is normal or not.

The detachable battery status alarm in accordance with the present invention has an alarm device and at least one battery detector. The battery detector is directly mounted on the battery and electronically connected to the battery. The alarm device links to the battery detector to obtain the battery status in a physical connection or a wireless connection. Therefore, the alarm device does not physically connect to the battery or batteries to test the battery or batteries.

Other objectives, advantages and novel features of the invention will become more apparent from the following detailed description when taken in conjunction with the accompanying drawings.

DETAILED DESCRIPTION OF THE PREFERRED EMBODIMENT

Figure 1:
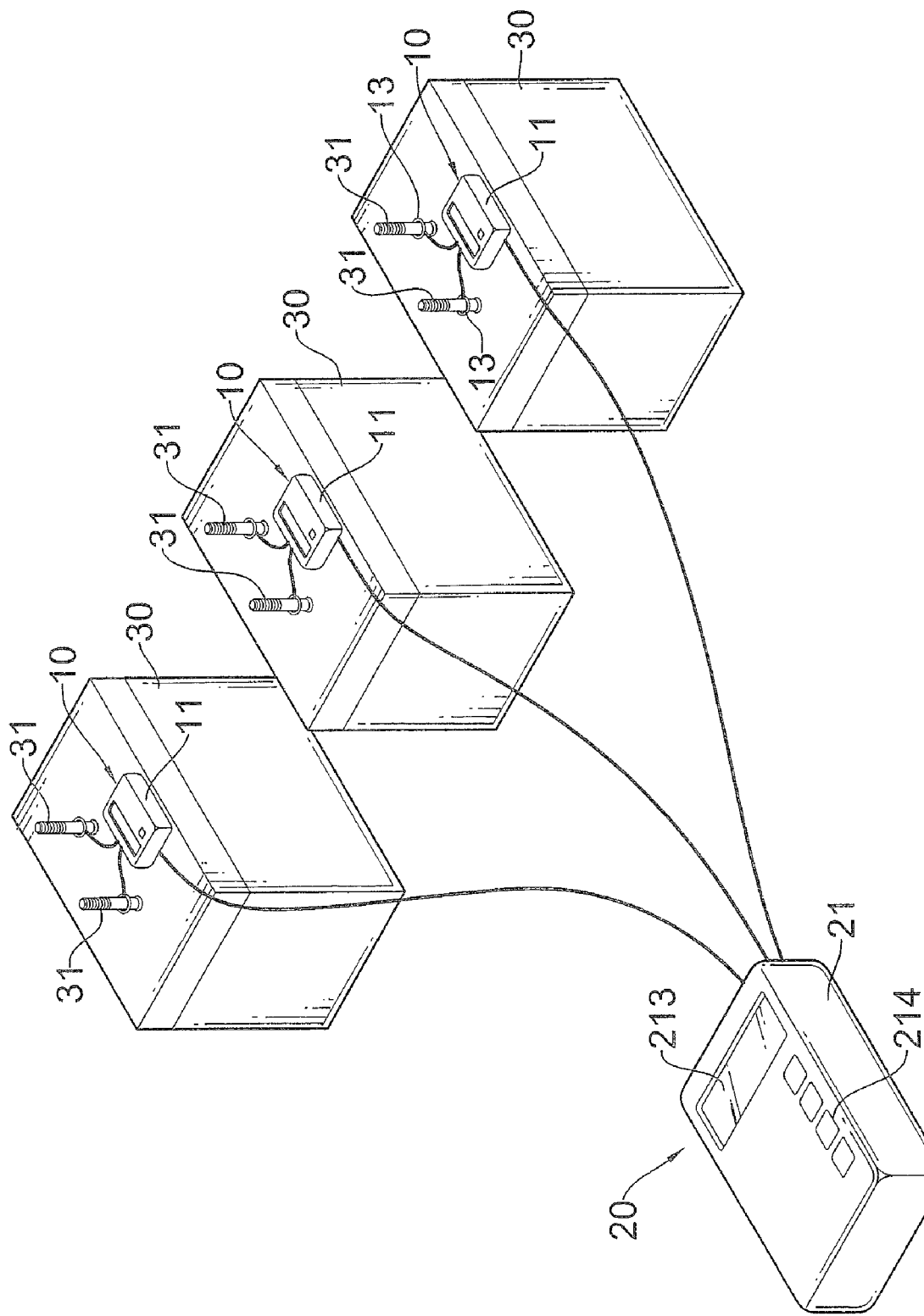
FIG. 1 is a perspective view of a first embodiment of a detachable battery status alarm connected to multiple individual batteries in accordance with the present invention.

With reference to FIG. 1, a perspective view of a first embodiment of a battery status alarm has an alarm device (20)

and at least one battery detector (10) separated from the alarm device (20). In the first embodiment of the detachable battery status alarm, three compact battery detectors (10) are electronically connected to the alarm device (20).

Figure 4A:
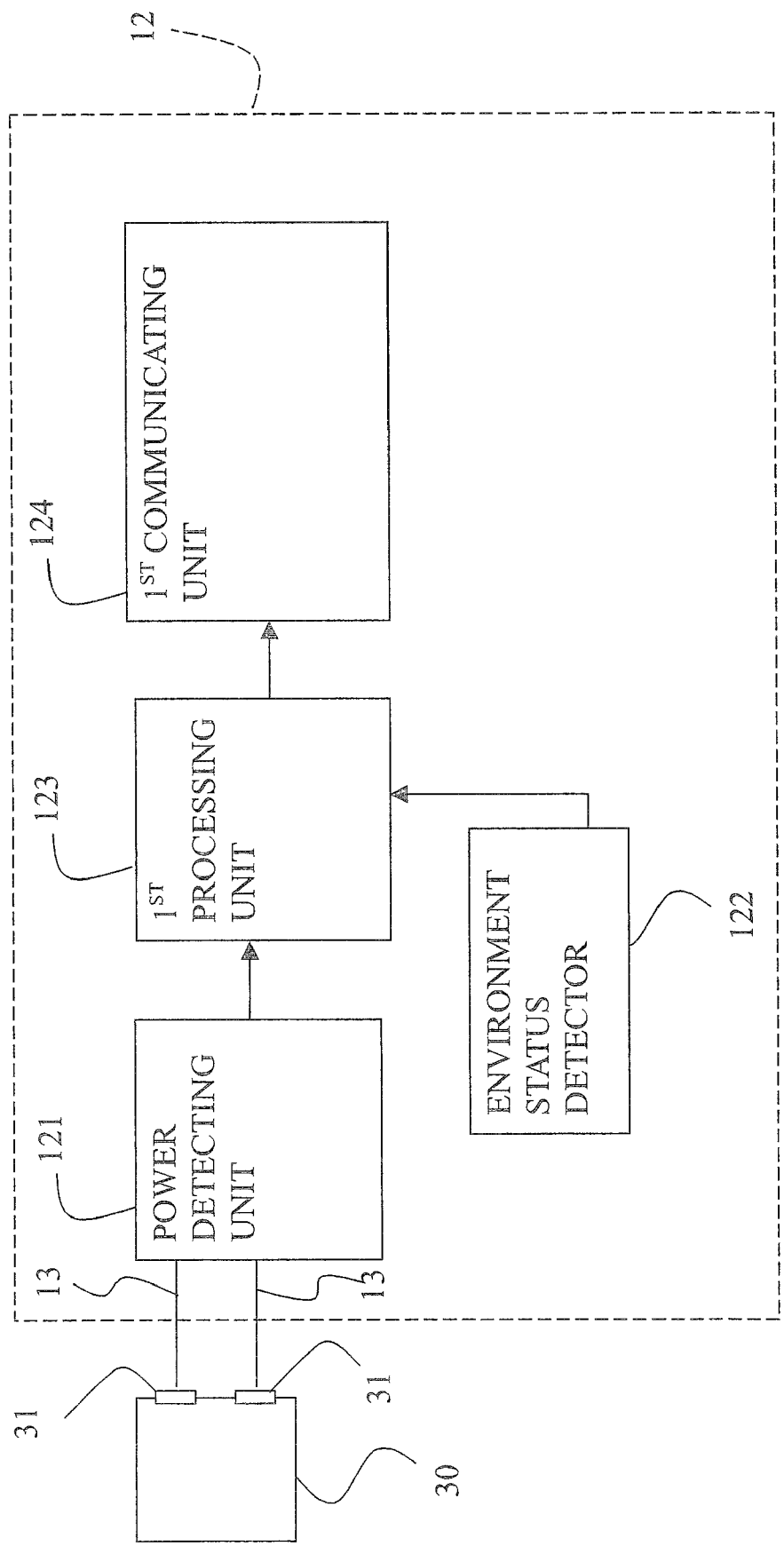
FIG. 4A is a functional diagram of a battery detector of the detachable battery status alarm in accordance with the present invention.

With further reference to FIG. 4A, the battery detectors (10) are respectively and electronically connected to the corresponding batteries (30). Each battery detector (10) has a casing (11), two electrode terminals (13) and a detecting and communicating circuit (12). The two electrode terminals (13) are mounted on the casing (11) and used to electronically connect to the positive and negative terminals (31) of the battery (30). The detecting and communicating circuit (12) is mounted inside the casing (11) and electronically connected to the two electrode terminals (13). Therefore, the detecting and communicating circuit (12) obtains a battery status of the battery (30) and transmits the battery status to the alarm device (20).

Figure 5A:
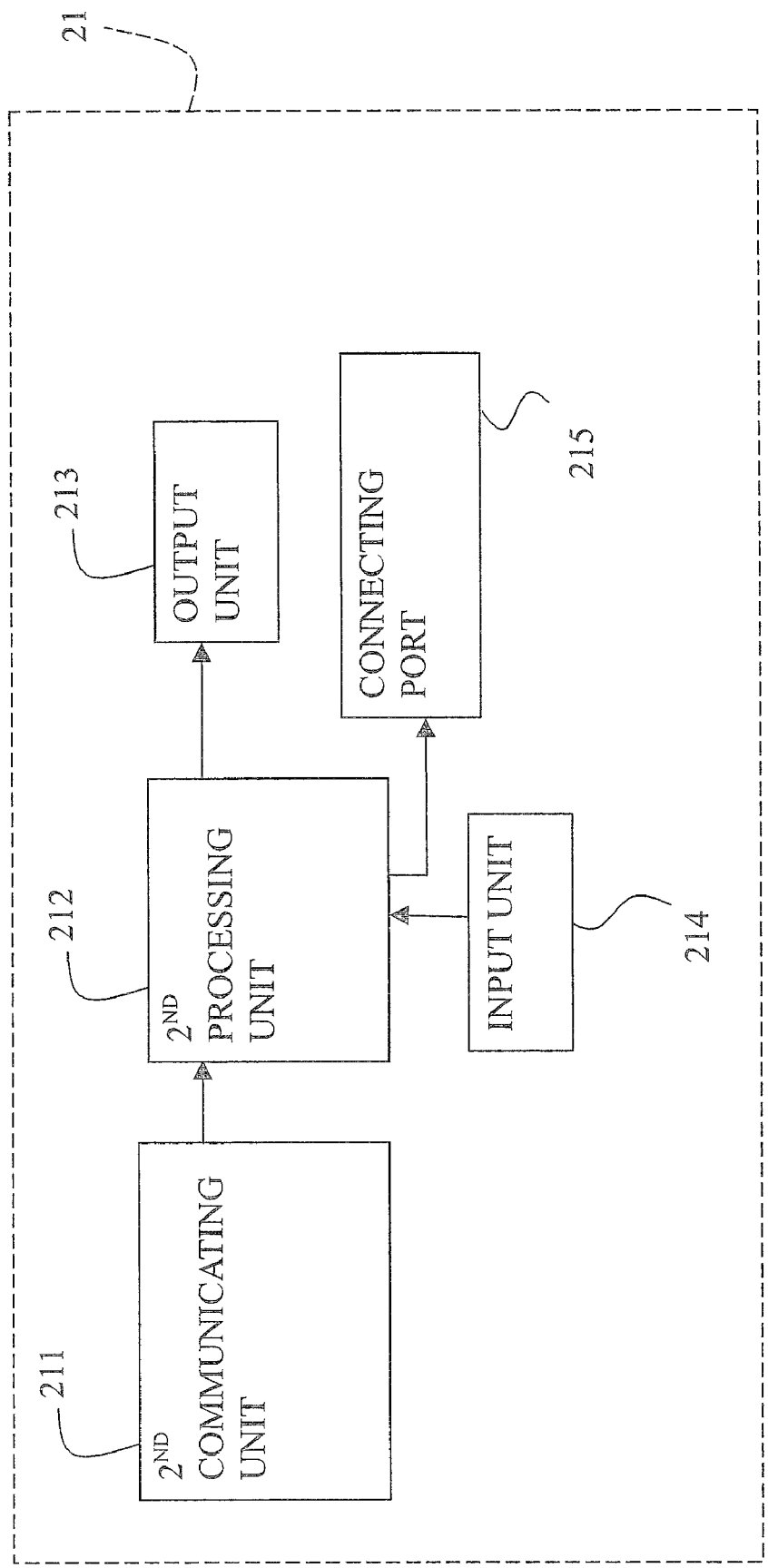
FIG. 5A is a functional diagram of an alarm device of the detachable battery status alarm in accordance with the present invention.

With further reference to FIG. 5A, the alarm device (20) links to each battery detector (10) to dual-communicate with each battery detector (10). In the first embodiment, the alarm device (20) is physically connected to each battery detector (10). The alarm device (20) has a shell (21) and a communicating and alarm circuit (21). The communicating and alarm circuit (21) receives and stores the battery statuses from the battery detectors (10). The communicating and alarm circuit (21) further determines whether the battery statuses are abnormal. If the battery status is abnormal, the communicating and alarm circuit (21) alarms the operator.

Figure 2:
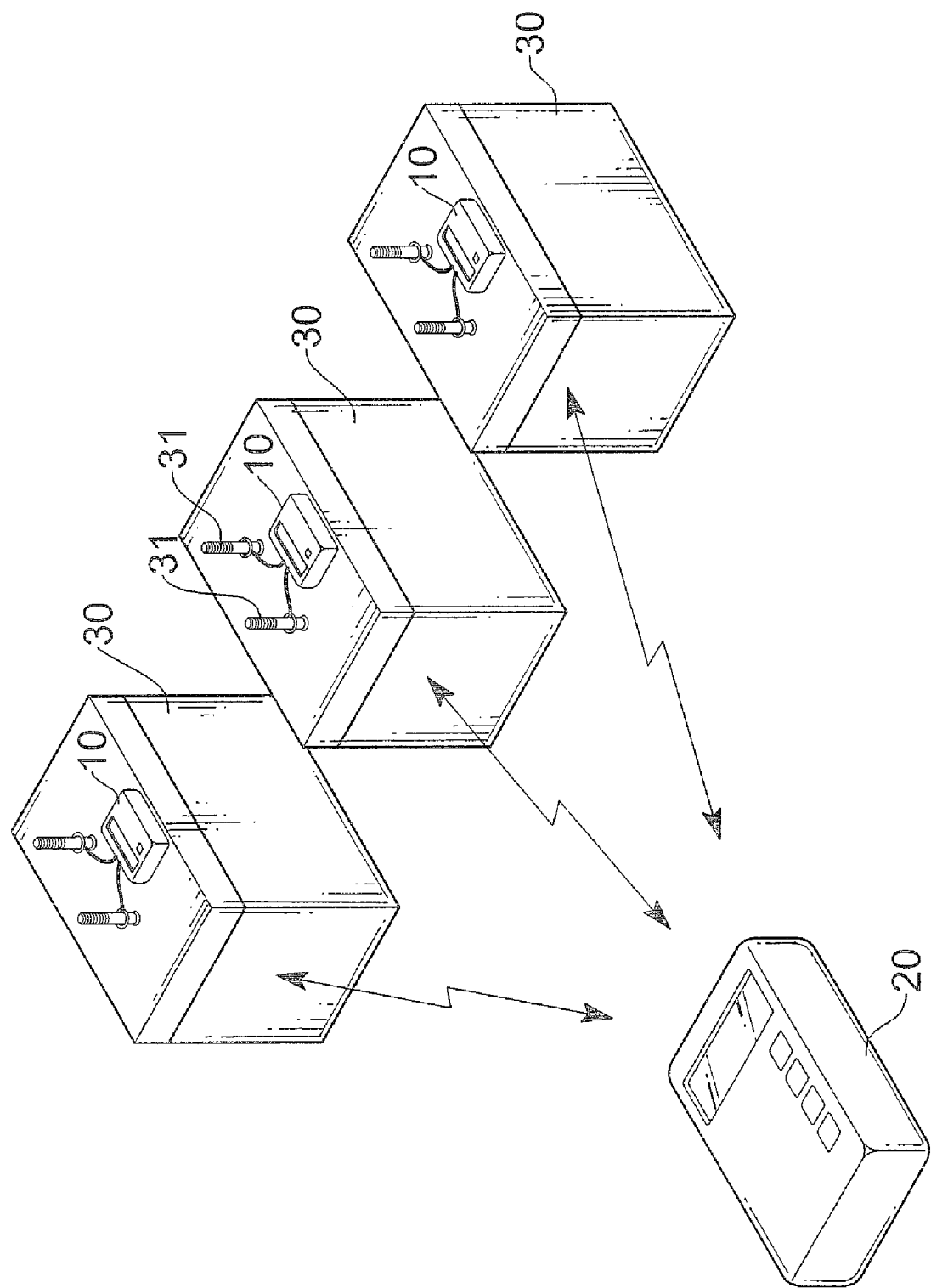
FIG. 2 is a perspective view of a second embodiment of a detachable battery status alarm connected to multiple individual batteries in accordance with the present invention.

With reference to FIG. 2, the second embodiment of the battery detector (10) is similar to the first embodiment, but the alarm device (20) wireless communicates with the battery detector (10) in a dual way.

Figure 3:
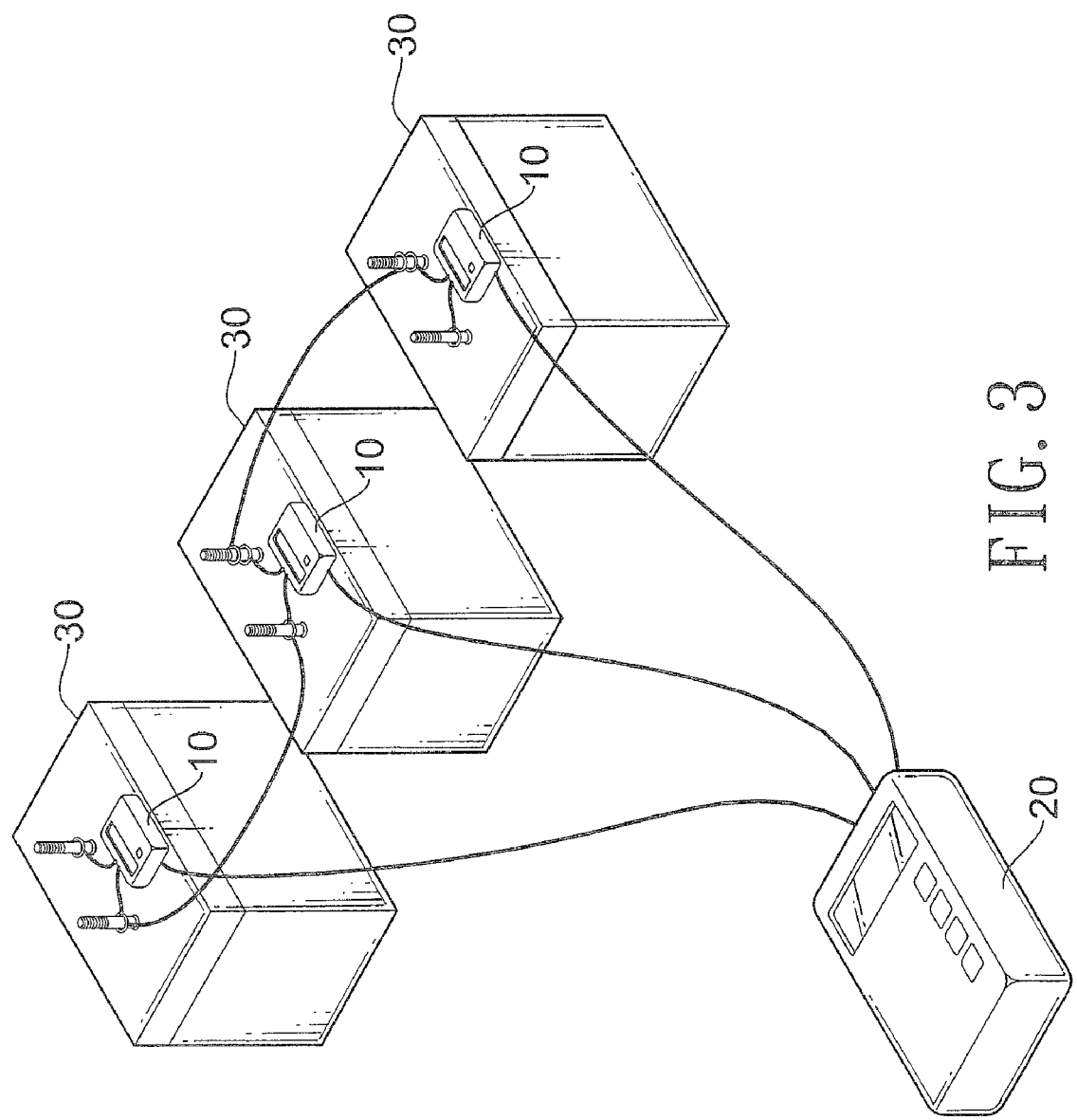
FIG. 3 is a perspective view of the battery status alarm connected to multiple serial connecting batteries in accordance with the present invention.

With reference to FIG. 3, each compact battery detector (10) is directly and electronically to the corresponding battery (30) and the multiple batteries (30) are freely to connect in serial or separate from each other. Therefore, the present invention is also applied to a battery set consisted of multiple battery units connected in serial.

Figure 4B:
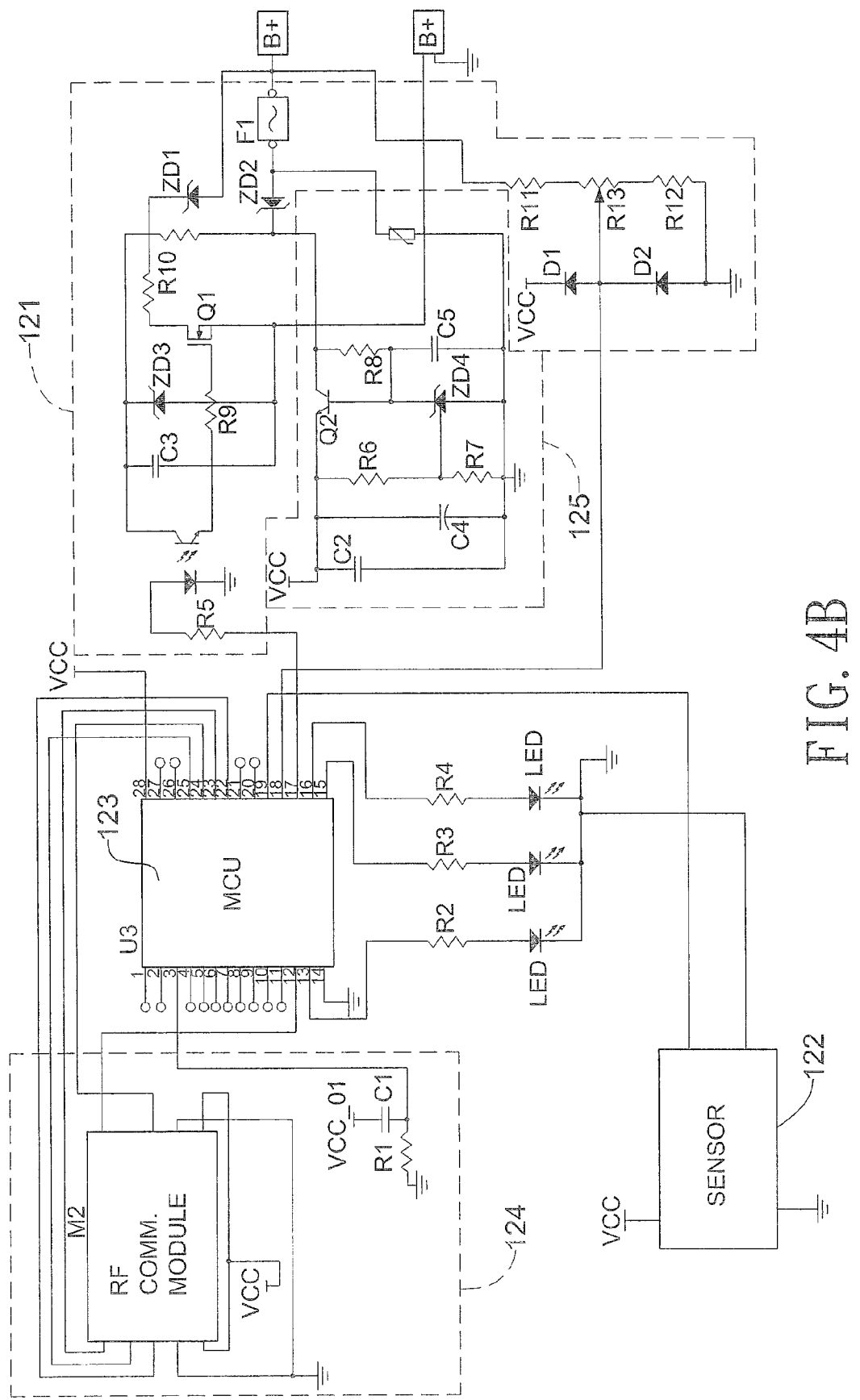
FIG. 4B is a detailed diagram of FIG. 4A.

With reference to FIGS. 4A and 4B, the detecting and communicating circuit (12) of the battery detector (10) has a power detecting unit (121), an environment status detector (122), a first processing unit (123) and a first communicating unit (124).

The power detecting unit (121) has a resistor load and an electrical switch. The resistor load is selectively and electronically connected to the two electrode terminals (13) through the electrical switch. In the first embodiment, the power detecting unit (121) further has a power regulator (125) electronically connected to the two electrode terminals (13). The power regulator (125) regulates a voltage of the battery to a DC voltage, and then outputs the DC voltage as power source. Therefore, the battery detector (10) does not require an external power source.

The environment status detecting unit (122) has an environment sensor such as a pressure sensor, a temperature sensor, a hygrometer, an acid and alkaline detector or an oxygen sensor. The environment status detecting unit (122) is mounted next to the corresponding battery (30).

The first processing unit (123) is electronically connected to the power detecting unit (121) and the environment status detector (122) and has a test procedure. The first processing unit (123) obtains the DC voltage to operate from the power regulator (125) of the power detecting unit (121). The first processing unit (123) executes the test procedure to control the electronic switch, so the resistor load is selectively and electronically connected to the battery (30). Then the first processing unit (123) obtains the power data of the battery (30) and then converts the power data to current battery status. The first processing unit (123) may be a microprocessor or a single chip.

The first communicating unit (124) is electronically connected to the first processing unit (123) and receives and converts the battery status in a specific format. Then the converted battery status is transmitted to the alarm device (20) in a physical connection or a wireless connection. The physical communicating module may be RS-232, USB or RJ-45 and the wireless communicating module may be a bluetooth, RF or IR etc. In the second embodiment, the first communicating unit (124) is a RF communicating module.

Based on foregoing description, the first processing unit (123) obtains the current battery status and the environment status of the corresponding battery (30). The first processing unit (123) further transmits the battery status and the environment status to the alarm device (20) through the first communicating device (124).

Figure 5B:
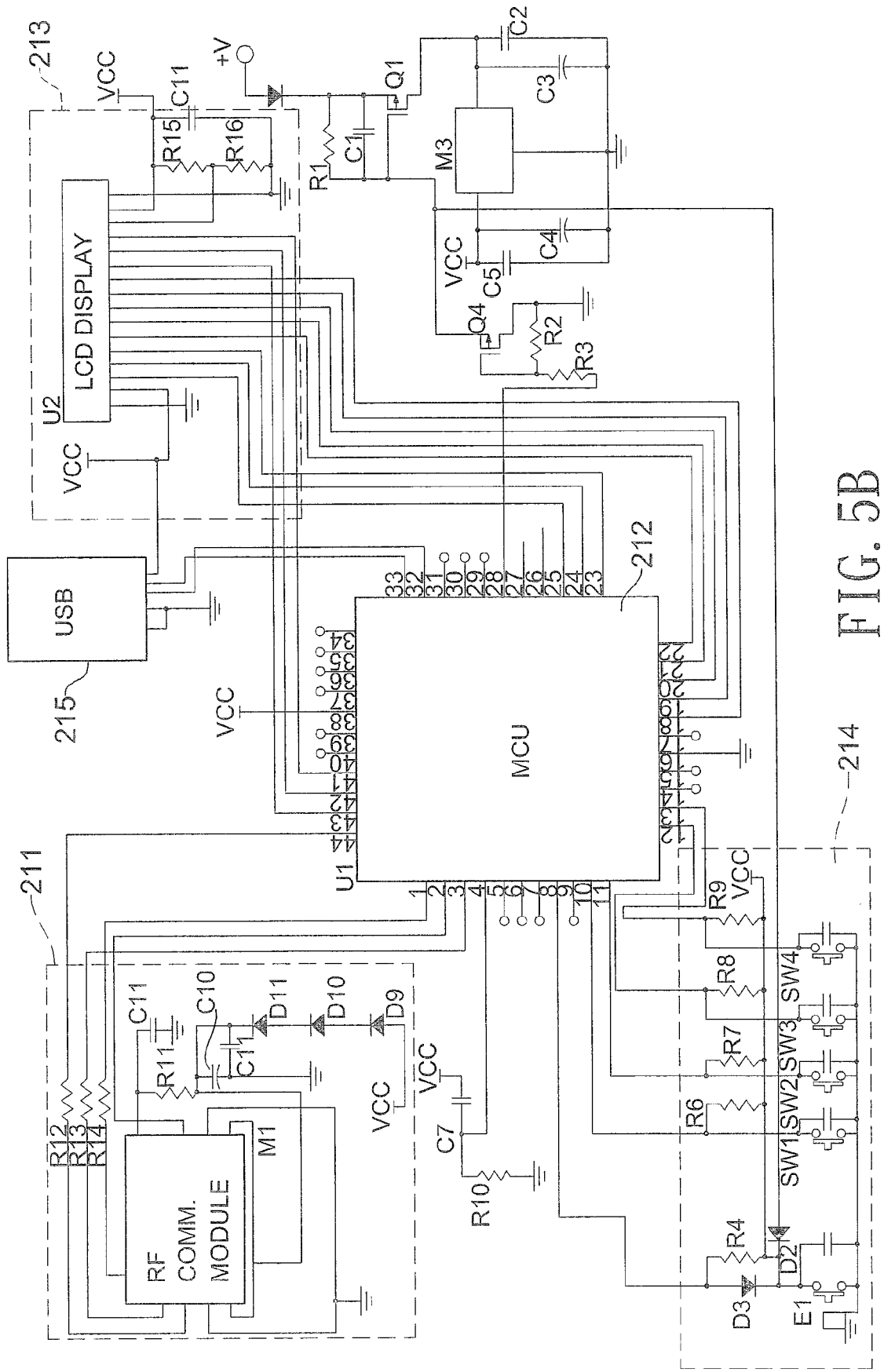
FIG. 5B is a detailed diagram of FIG. 5A.

With reference to FIGS. 5A and 5B, the communicating and alarm circuit (21) of the alarm device (20) has a second communicating unit (211), a second processing unit (212), an output unit (123) and an input unit (124).

The second communicating unit (211) links to the first communicating units (124) of the battery detectors (10) to receive battery statuses and environment statuses for the batteries (30). In the second embodiment, the second communicating unit (211) is a RF communicating module.

The second processing unit (212) is electronically connected to the second communicating unit (211) to receive the battery statuses and environment statuses. The second processing unit (212) has an alarm procedure. When the second processing unit (212) executes the alarm procedure, the second processing unit (212) determines whether the battery statuses or the environment statuses are abnormal.

The output unit (213) is electronically connected to outputs of the second processing unit (212), so the second processing unit (212) outputs the battery statuses and environment statuses for the batteries (30) to the output unit (213). The output unit (213) outputs the battery statuses and environment statuses in different audio or visible format. The output unit (213) may be a display, a printer, a buzzer or light indicators etc devices. Further, the output unit (213) alarms to the operator when the second processing unit (212) determines that the battery statuses or environment statuses are abnormal. In the preferred embodiment, the output unit (213) is a LCD display.

The input unit (215) is electronically connected to input of the second processing unit (212) and may be a keyboard or a mouse etc. device. Therefore, the input unit (215) is used to set parameters of the second processing unit (212).

The communicating and alarm circuit (21) has a connecting port (215) such as an RS-232, RJ45, Bluetooth, RF, UART, USB, I²C or IR etc. The connecting port (215) is used to connect an external device, such as a computer.

Based on the foregoing description, the second processing unit (212) obtains the battery statuses and environment statuses of all batteries (30) and further determines whether the output unit (213) alarms to the operator. Further, the second processing unit (212) outputs the battery statuses and environment statuses to the computer through the connecting port (215). Therefore, a remote computer can be connected to the alarm device (20) to obtain, store and analyze the battery statuses and environment statuses.

Figure 6:
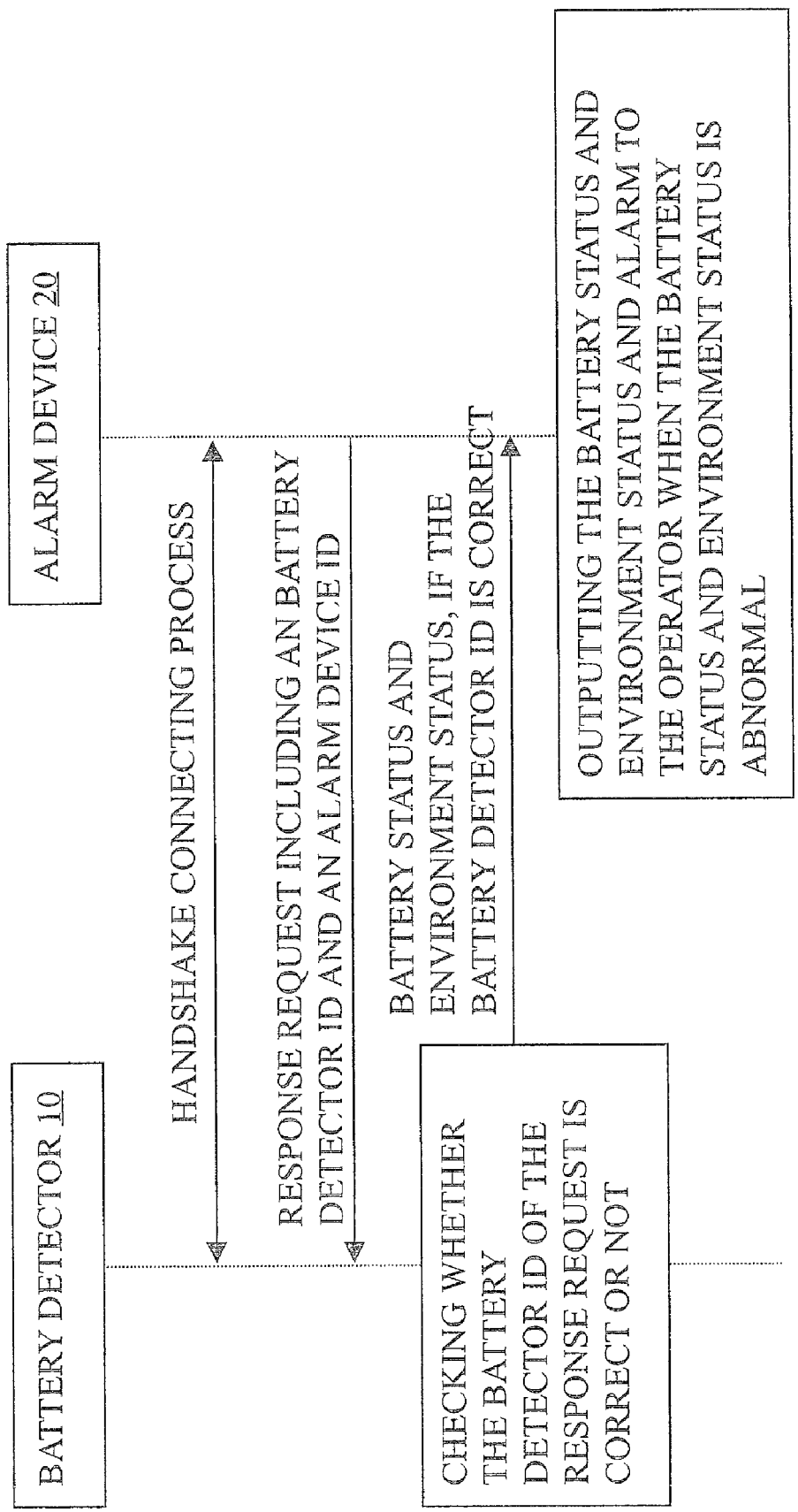
FIG. 6 is a flow chart of a data communicating procedure applied to one alarm device to one battery detector.

With further reference to FIG. 6, a data communicating procedure between the alarm device and a signal battery detector is further explained as follow.

The alarm device (20) first recognizes all battery detectors (10) by a handshake connecting process. The alarm device

(20) transmits a response request including a battery detector identification (ID) and an alarm device identification (ID) to the battery detector (10). When the battery detector (10) receives the response request, the battery detector (10) checks whether the battery detector ID is correct or not. If the battery detector (10) does not match the battery detector ID preset inside the battery detector (10), the battery detector (10) does not response the response request. If the battery detector ID is correct the battery detector (10) sends the battery status, the environment status and a battery detector ID to the alarm device (20). At the time, the alarm device (20) outputs the battery status and environment status to the output unit (213) and further determines whether the battery status or the environment status is abnormal. If the determining result is positive, the output unit (213) further alarms the alarm device operator. Since the compact battery detector (10) is directly connected to the battery (30), the alarm device (20) does not physically connected to the battery (30) to test the battery status. Further, the alarm device (20) also outputs the battery status and the environment status to the computer and the computer stores the battery status and the environment status.

In the first embodiment, the alarm device (20) automatically executes the above data communicating procedure and cyclically obtains the battery status and the environment status. The operator also uses the input device (214) to control whether the data communicating procedure is executed or not.

Figure 7A:
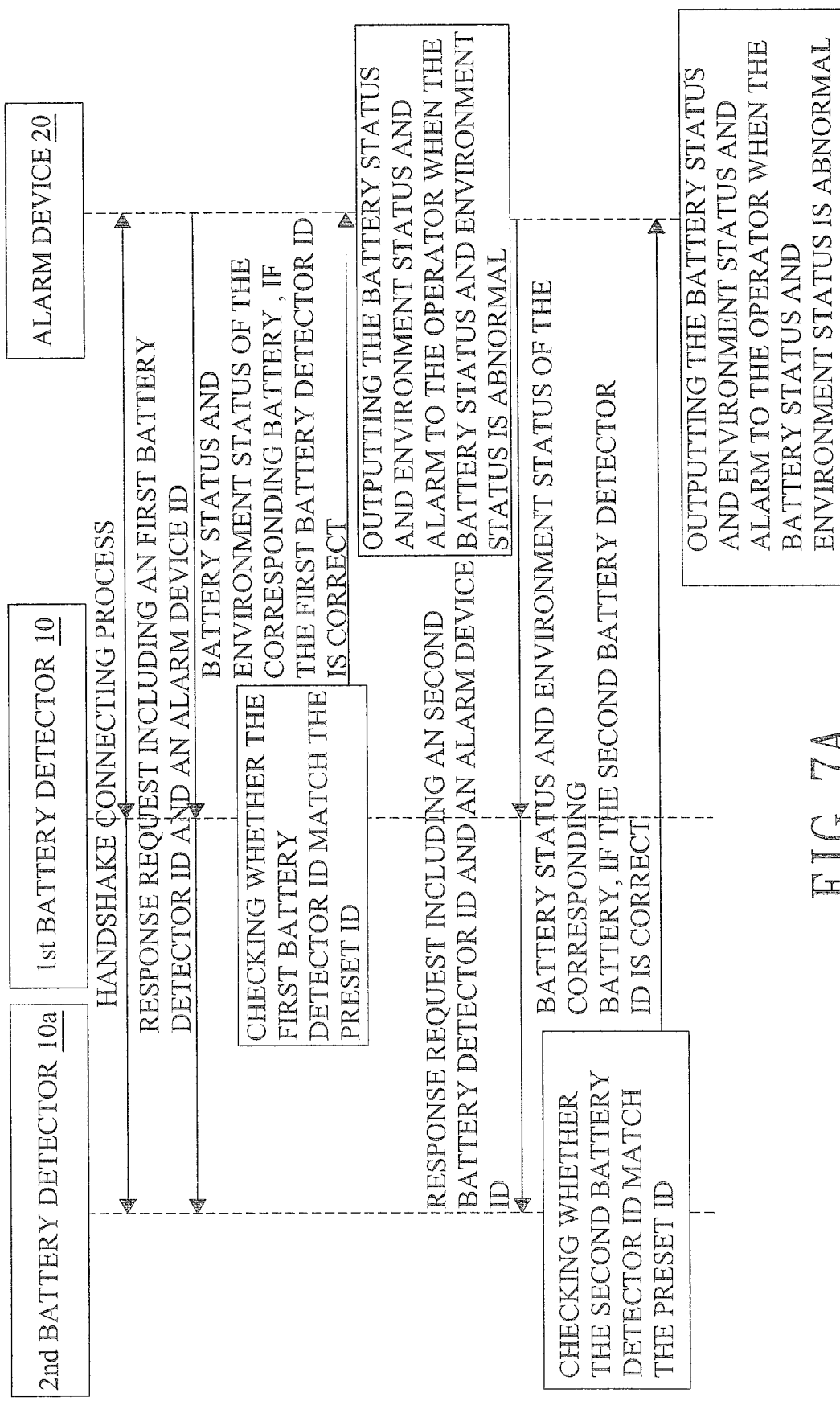
FIG. 7A is a flow chart of a first example of a data communicating procedure applied to one alarm device to multiple battery detector.

With reference to FIG. 7A, another data communicating procedure between the alarm device (20) and two battery detectors (10) is further explains as follow.

The alarm device (20) first recognizes all battery detectors (10) by a handshake connecting process. The alarm device (20) transmits a response request including a first battery detector ID and the alarm device ID. The request response will be received the first and second battery detectors (10, 10a), but only the first battery detector (10) will send the battery status and the environment status of the corresponding battery to the alarm device (20) since the first battery detector ID of the response request matches the own battery detector ID of the first battery detector (10). The alarm device (20) drives the display to display the received the battery status and the environment status of the corresponding battery. At the time, the alarm device (20) also determines whether the battery status and the environment status of the corresponding are abnormal or not. If the determining result is positive, the alarm device (20) alarms to the operator. The alarm device (20) transmits a next response request including a second battery detector ID and the alarm device ID. The request response will be received the first and second battery detectors (10, 10a), but only the second battery detector (10a) will send the battery status and the environment status of the corresponding battery to the alarm device (20) since the second battery detector ID of the response request matches the own battery detector ID of the second battery detector (10a). The alarm (20) also displays them on the display and determines whether they are abnormal or not.

Therefore, the alarm device (20) automatically links to each battery detector (10) and select a specific battery detector (10, 10a) to response the current battery status and the environment status of the corresponding battery. The alarm device (20) obtains all battery statues and environment status of the batteries (30) through the battery detectors (10) on the corresponding batteries (30). The alarm device (20) does not physically connected to the batteries (20) one by one, the battery status and the environment status of each battery (30) will be obtained. Then the alarm device (20) determines whether the battery status or the environment status of each battery (30) is abnormal. Since the alarm device (20) obtains the battery detector ID, the abnormal status of the specific battery detector (10) will be output to the output unit (213) to alarm the operator. The operator clearly understands which one battery (30) is abnormal now.

Figure 7B:
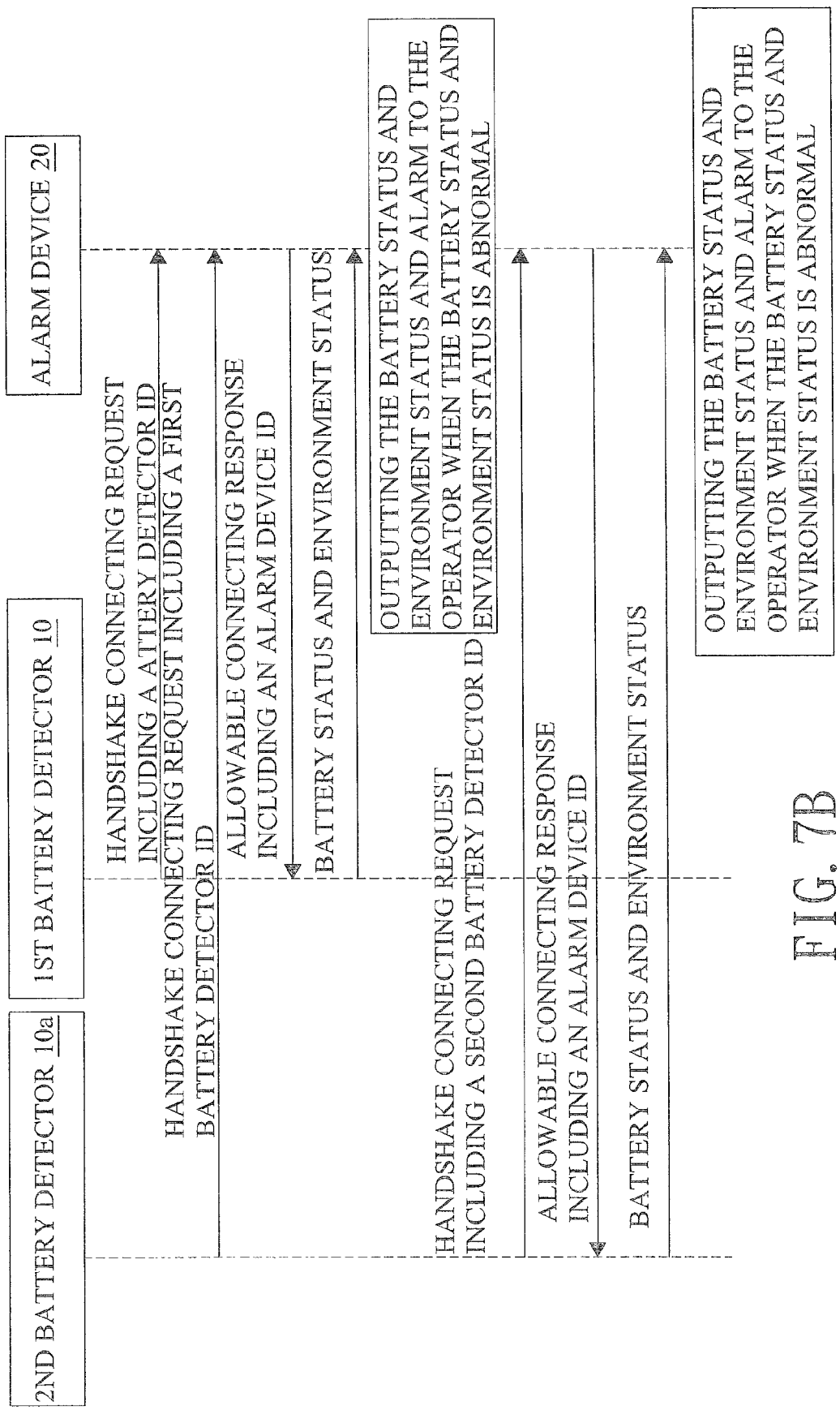
FIG. 7B is a flow chart of a second example of a data communicating procedure applied to one alarm device to multiple battery detector.
Figure 8:
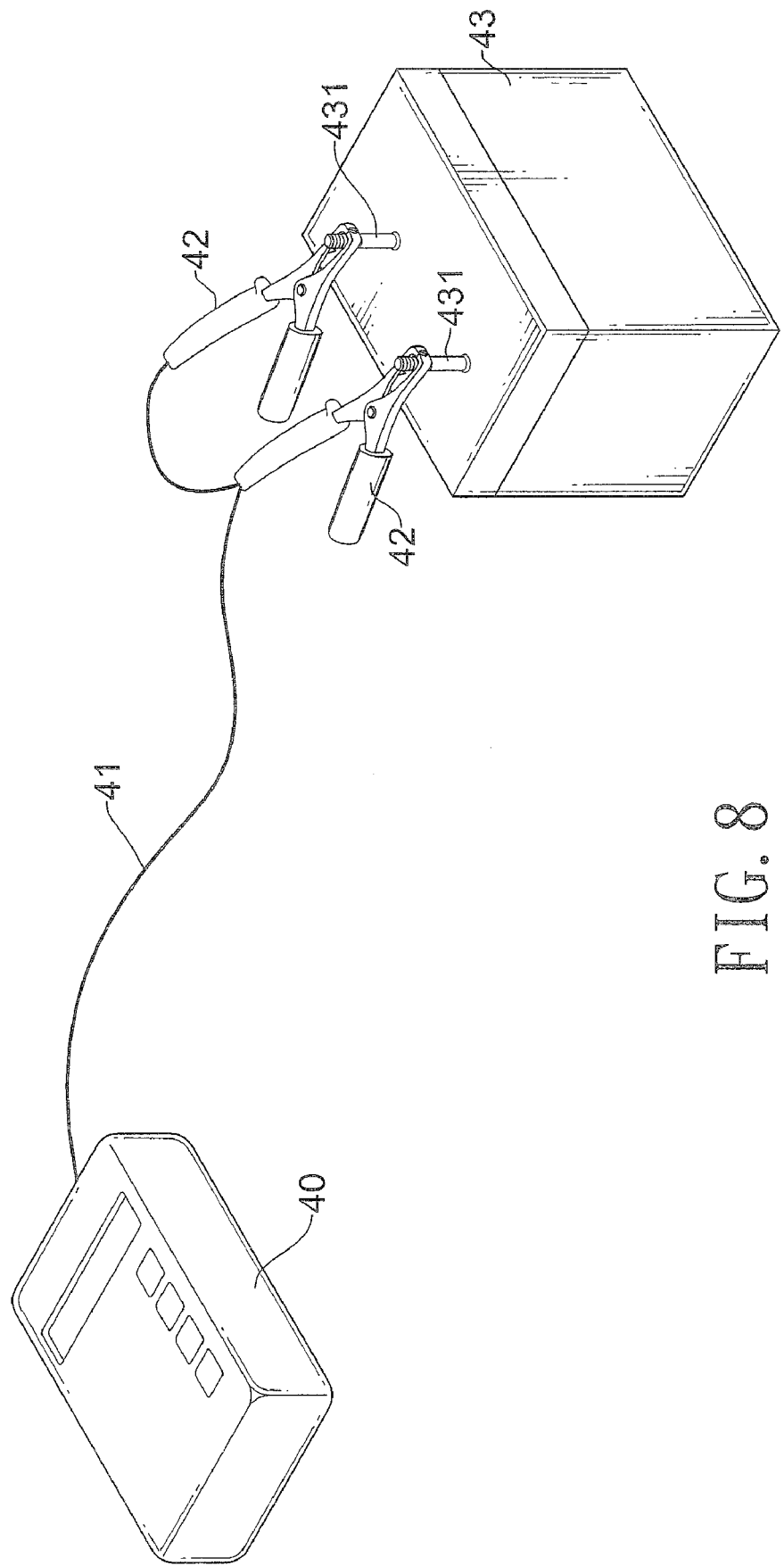
FIG. 8 is a perspective view of a conventional battery tester connected to a battery in accordance with the prior art.
Figure 9:
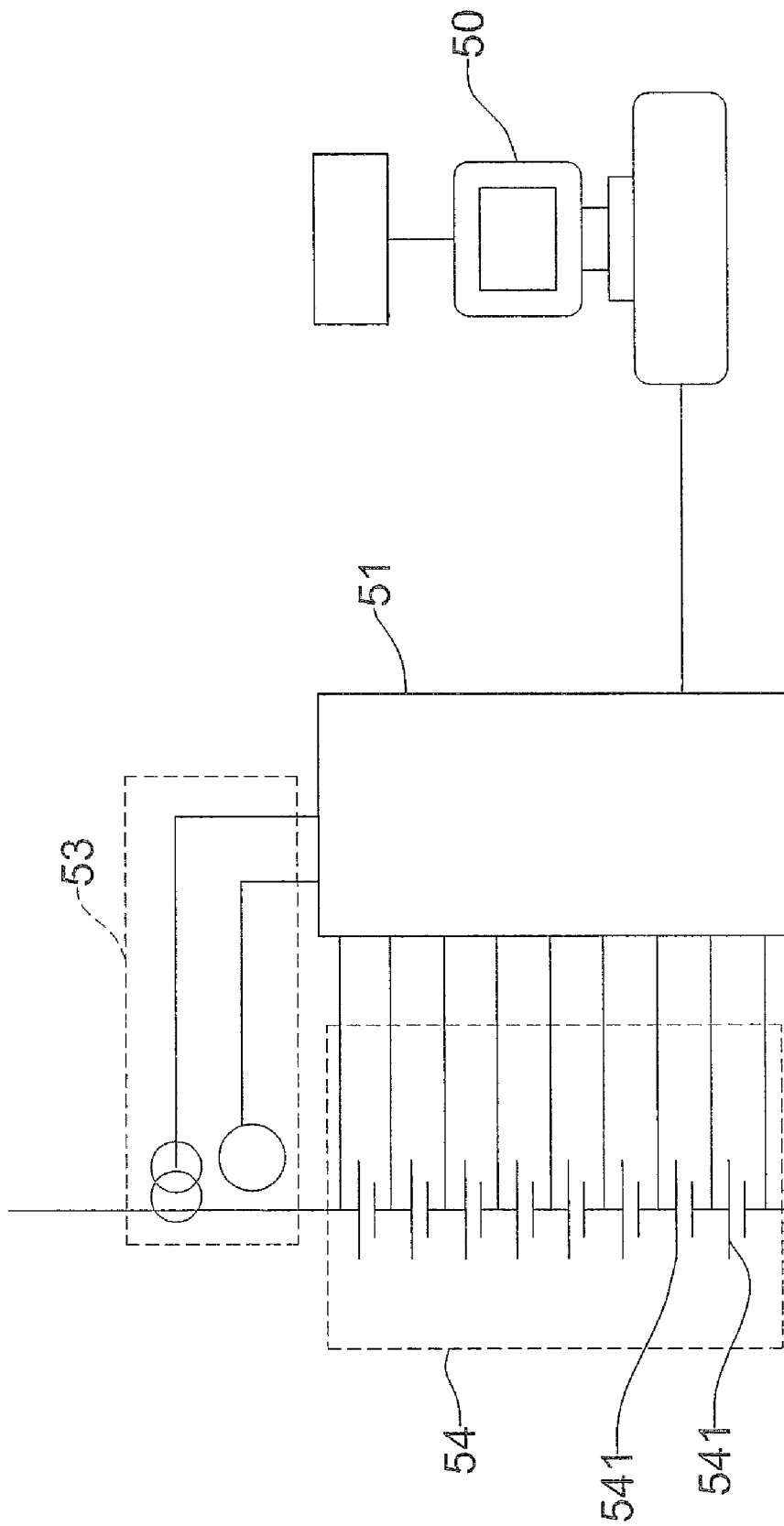
FIG. 9 is a block diagram of a first example of a battery monitoring system connected to multiple serial connecting batteries in accordance with the prior art.
Figure 10:
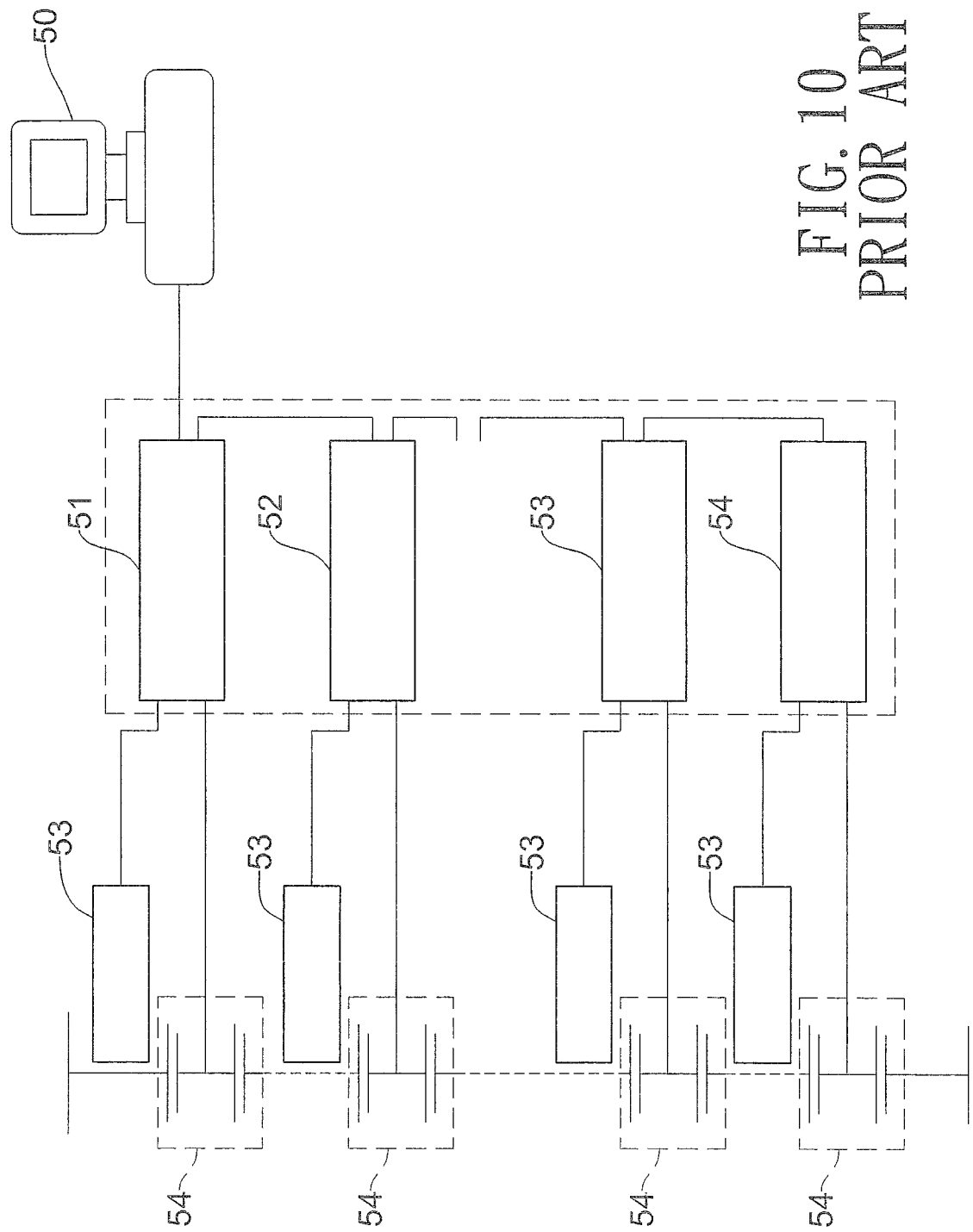
FIG. 10 is a block diagram of a second example of a battery monitoring system connected to multiple serial connecting batteries in accordance with the prior art.

With reference to FIG. 7B, another data communicating procedure between one alarm device (20) and multiple battery detectors (10) is further described as follow. The battery detectors (10) first respectively transmit the connecting requests to the alarm device (20). If the alarm device (20) first received the connecting request of the first battery detector (10), the alarm device (20) sends an allowable connecting response to the first battery detector (10). Then the first battery detector (10) sends the battery status and the environment status to the alarm device (20). When the alarm device (20) successfully received the battery status and the environment status of the first battery detector (10) and then receives a connecting request from the second battery detector (10), the alarm device (20) sends an allowable connecting response to the second battery detector (10). The second battery detector (10) transmits the battery status and the environment status to the alarm device (20) after the allowable connecting response is received. Therefore, each battery detector (10) automatically requests to link to the alarm device (20) and transmits the battery status and environment status to alarm device (20).

In addition, the test procedure of the first processing unit of the battery detector (10) has following steps of:

(a) obtaining an initial voltage of a the battery;

(b) applying the resistor load to the battery for a first time period of 0.1 milliseconds to one second;

(c) measuring a first voltage at the end of the first time period;

(d) removing the resistor load;

(e) measuring a second voltage at the end of a first recovery time period after removing the resistor load;

(f) measuring a third voltage at the end of a second recovery time period after removing the resistor load; and (g) analyzing the condition of the battery.

An internal resistance of the battery is calculated according to the equation: $Ri=(V4-V2)/(V2/Rload)$ where Rload is the resistor load and Ri is the internal resistance. The internal resistance of the battery is used to calculate the capacity of the battery. The measured voltages also are used to determine whether the battery passes or fails. Whether the battery passes the test can be determined by calculating the capacity of the battery and comparing with the input capacity. If the calculated capacity is greater than a predetermined percentage of the input capacity, for example, ninety percent, the battery passes the test. If a difference between the third voltage and the second voltage (V4−V3) is greater than a predetermined voltage, for example, 100 millivolts, then the battery passes the test. If difference between the third voltage and the second voltage (V4−V3) is less than the predetermined voltage then the battery fails the test. If the battery fails the test, then the battery detector re-executes the test procedure. If the test is not passed again, after a recharge, then the battery status is abnormal.

The second recovery time is longer than the first recovery time period and the second time period is longer than the first time period. The first time period may be 0.1 ms to 1 s or 1 ms. The first recovery time period may be 0.2 ms to 1 s or 0.5 ms to 5 s. The second recovery time period may be 0.6 ms to 10 s or 60 ms to 100 s.

In addition, the first processing unit further obtains or calculates the battery voltage, the battery current, the cold cranking ampere (CCA), the ampere-hour (AH), the cranking amps (CA), the marine cranking ampere (MCA), charge status, watt-hour (WH).

Based on the foregoing description, the detachable battery status alarm in accordance with the present invention may be applied to monitor single battery or multiple battery. Since the compact battery detector is directly mounted on the battery and electronically connected to the battery, the alarm device obtains the battery status through the compact battery detector without physical connecting with the battery. Further, if one battery of the serial connecting batteries is damaged, the alarm device still obtains the battery statuses of other batteries.

Even though numerous characteristics and advantages of the present invention have been set forth in the foregoing description, together with details of the structure and function of the invention, the disclosure is illustrative only. Changes may be made in detail, especially in matters of shape, size, and arrangement of parts within the principles of the invention to the full extent indicated by the broad general meaning of the terms in which the appended claims are expressed.

What is claimed is:

1. A detachable battery status alarm comprising:
   at least one battery detector having:
      a casing;
      two electrode terminals mounted on the casing and adapted to electronically connected to a battery; and
      a detecting and communicating circuit mounted inside the casing, electronically connected to the two electrode terminals to obtain a battery status of the battery and then output the battery status; and
   an alarm device linking to each of the at least one battery detector, dual-communicating with the battery detector and having:
      a shell; and
      a communicating and alarm circuit mounted inside the shell, receiving and storing the battery statuses from each of the at least one battery detector, and determining whether the battery statuses are abnormal; if a determining result positive, the communicating and alarm circuit alarms.

2. The detachable battery status alarm as claimed in claim 1, wherein the detecting and communicating circuit comprises:
   a power detecting unit having:
   an electronic switch; and
   a resistor load electronically connected to the two electrode terminals through the electronic switch and adapted to selectively connected to the battery;
   a first processing unit electronically connected to the power detecting unit and has a test procedure to control the electronic switch to turn on or turn off, and then the resistor load selectively connected to the two electrode terminals;
   a first communicating unit electronically connected to the first processing unit and transmitting the battery status to the alarm device;
   a power regulator electronically connected to the two electrode terminals, regulating a voltage of the battery and then outputting a DC voltage to the first processing unit, the first communicating unit and power detecting unit.

3. The detachable battery status alarm as claimed in claim 2, wherein the test procedure has steps of:
   (a) obtaining an initial voltage of the battery;
   (b) applying the resistor load to the battery for a first time period;
   (c) measuring a first voltage at the end of the first time period;
   (d) removing the resistor load;
   (e) measuring a second voltage at the end of a first recovery time period after removing the resistor load;
   (f) measuring a third voltage at the end of a second recovery time period after removing the resistor load; and
   (g) analyzing the condition of the battery having acts of:
      (g1) calculating an internal resistance of the battery by an equation: $Ri=(V4-V2)/(V2/Rload)$, wherein Ri is the internal resistance and Rload is the resistor load;
      (g2) calculating a current capacity of the battery by the internal resistance;
      (g3) determining whether the current capacity of the battery is greater than a preset capacity; if a determining result is positive, the battery is normal and on the contrary, the battery is abnormal; and
      (g4) determining a difference between the third voltage and the second voltage is greater than a preset voltage; if a determining result is positive, the battery is normal and on the contrary, the battery is abnormal.

4. The detachable battery status alarm as claimed in claim 3, wherein the second recovery time is longer than the first recovery time period and the second time period is longer than the first time period.

5. The detachable battery status alarm as claimed in claim 4, wherein the first time period is 0.1 ms to 1 s or 1 ms, the first recovery time period is 0.2 ms to 1 s or 0.5 ms to 5 s and the second recovery time period is 0.6 ms to 10 s or 60 ms to 100 s.

6. The detachable battery status alarm as claimed in claim 5, further comprising an environment status detecting unit electronically connected to the first processing unit, adapted to mount next to the battery, wherein the first processing unit obtains an environment status of the battery through the environment status detecting unit.

7. The detachable battery status alarm as claimed in claim 4, further comprising an environment status detecting unit electronically connected to the first processing unit, adapted to mount next to the battery, wherein the first processing unit obtains an environment status of the battery through the environment status detecting unit.

8. The detachable battery status alarm as claimed in claim 3, wherein the first processing unit further obtains or calculates the battery voltage, the battery current, the cold cranking ampere (CCA), the ampere-hour (AH), the cranking amps (CA), the marine cranking ampere (MCA), charge status, watt-hour (WH).

9. The detachable battery status alarm as claimed in claim 8, further comprising an environment status detecting unit electronically connected to the first processing unit, adapted to mount next to the battery, wherein the first processing unit obtains an environment status of the battery through the environment status detecting unit.

10. The detachable battery status alarm as claimed in claim 3, further comprising an environment status detecting unit electronically connected to the first processing unit, adapted to mount next to the battery, wherein the first processing unit obtains an environment status of the battery through the environment status detecting unit.

11. The detachable battery status alarm as claimed in claim 10, wherein the environment status detecting unit comprises an environment sensor and the environment sensor is a pressure sensor, a temperature sensor, a hygrometer, an acid and alkaline detector or an oxygen sensor.

12. The detachable battery status alarm as claimed in claim 11, wherein the communicating and alarm circuit of the alarm unit comprises:
- a second communicating unit linking to the first communicating unit of each of the at least one battery detector to receive the battery statuses and environment statuses;
- a second processing unit electronically connected to the second communicating unit to receive the battery status and environment statuses, and having inputs, outputs and an alarm procedure to determine whether the battery status or environment is abnormal;
- an output unit electronically connected to outputs of the second processing unit, so the second processing unit outputs the battery statuses or environment statuses to the output unit, and controlling the output unit to alarm after the battery status or environment status is abnormal; and
- an input unit electronically connected to the inputs of the second processing unit to set parameters of the second processing unit.

13. The detachable battery status alarm as claimed in claim 12, wherein the output unit is a display, a printer, a buzzer or a light indicator; and the input unit is a keyboard or a mouse.

14. The detachable battery status alarm as claimed in claim 13, wherein the alarm device further comprises a connecting port electronically connected to the second processing unit and adapted to connect to an external device.

15. The detachable battery status alarm as claimed in claim 14, wherein the connecting port is RS-232, RJ45, Bluetooth, RE, UART, USB, I.sup.2C or IR module.

16. The detachable battery status alarm as claimed in claim 13, wherein the first and second communicating units are physically connected or wireless connected to each other.

17. The detachable battery status alarm as claimed in claim 12, wherein the alarm device further comprises a connecting port electronically connected to the second processing unit and adapted to connect to an external device.

18. The detachable battery status alarm as claimed in claim 17, wherein the first processing unit of each of the at least one battery detector further comprises a first data communicating procedure, wherein the first data communicating procedure comprises steps of:
- executing a handshake connecting process to link the alarm device;
- waiting to receive a response request from the alarm device, wherein the response request including a battery detector identification and an alarm device identification;
- determining whether the battery detector identification matches a battery detector identification preset inside the battery detector; if not, go to the step of executing a handshake connecting process and if so, go to next step; and
- transmitting the battery status and the environment status to the alarm device after the response request is received.

19. The detachable battery status alarm as claimed in claim 18, wherein the second processing unit of the alarm device further comprises a second data communicating procedure, wherein the second data communicating procedure comprises steps of:
- executing a handshake connecting process to link the corresponding battery detector;
- transmitting a response request to the corresponding battery detector, wherein the response request includes an battery detector identification of the corresponding detector battery detector and the alarm device identification;
- waiting to receive the battery status or environment status from the corresponding battery detector; and
- outputting the battery status or environment status to the output unit.

20. The detachable battery status alarm as claimed in claim 2, wherein the first processing unit is a microprocessor or a single chip.

21. A compact battery detector, comprising:
- a casing;
- two electrode terminals mounted on the casing and adapted to be electronically connected to a battery; and
- a detecting and communicating circuit mounted inside the casing, electronically connected to the two electrode terminals to obtain a battery status of the battery and then output the battery status, and comprising:
  - a power detecting unit having:
    - an electronic switch; and
    - a resistor load electronically connected to the two electrode terminals through the electronic switch and adapted to be selectively connected to the battery;
  - a first processing unit electronically connected to the power detecting unit and having a test procedure to control the electronic switch to turn on or turn off, and then the resistor load selectively connected to the two electrode terminals; and
  - a first communicating unit electronically connected to the first processing unit.

22. The compact battery detector as claimed in claim 21, wherein the test procedure includes:
- (a) obtaining an initial voltage of a battery;
- (b) applying the resistor load to the battery for a first time period;
- (c) measuring a first voltage at the end of the first time period;
- (d) removing the resistor load;
- (e) measuring a second voltage at the end of a first recovery time period after removing the resistor load;
- (f) measuring a third voltage at the end of a second recovery time period after removing the resistor load; and
- (g) analyzing the condition of the battery having acts of:
  - (g1) calculating an internal resistance of the battery by an equation: $Ri=(V4-V2)/(V2/Rload)$, wherein Ri is the internal resistance and Rload is the resistor load;
  - (g2) calculating a current capacity of the battery by the internal resistance;
  - (g3) determining whether the current capacity of the battery is greater than a preset capacity; if a determining result is positive, the battery is normal and on the contrary, the battery is abnormal; and
  - (g4) determining a difference between the third voltage and the second voltage is greater than a preset voltage; if a determining result is positive, the battery is normal and on the contrary, the battery is abnormal.

23. The detachable battery status alarm as claimed in claim 22, wherein the second recovery time is longer than the first recovery time period and the second time period is longer than the first time period.

24. The compact battery detector as claimed in claim 23, wherein the first time period is 0.1 ms to is or 1 ms, the first recovery time period is 0.2 ms to 1 s or 0.5 ms to 5 s and the second recovery time period is 0.6 ms to 10 s or 60 ms to 100 s.

25. The compact battery detector as claimed in claim 22, wherein the first processing unit further obtains or calculates the battery voltage, the battery current, the cold cranking ampere (CCA), the ampere-hour (AH), the cranking amps (CA), the marine cranking ampere (MCA), charge status, watt-hour (WH).

26. The compact battery detector as claimed in claim 21, wherein the first processing unit is a microprocessor or a single chip.

27. The compact battery detector as claimed in claim 21, wherein the first communicating unit is a physically communicating module or a wireless communicating module.

28. A compact battery detector, comprising:
 a casing;
 two electrode terminals mounted on the casing and adapted to be electronically connected to a battery;
 a detecting and communicating circuit mounted inside the casing, electronically connected to the two electrode terminals to obtain a battery status of the battery and then output the battery status; and
 an environment status detecting unit electronically connected to the first processing unit, adapted to mount next to the battery, wherein the first processing unit obtains an environment status of the battery through the environment status detecting unit.

29. The compact battery detector as claimed in claim 28, wherein the environment status detecting unit comprises an environment sensor and the environment sensor is a pressure sensor, a temperature sensor, a hygrometer, an acid and alkaline detector or an oxygen sensor.

* * * * *